(12) United States Patent
Liang et al.

(10) Patent No.: US 9,460,989 B2
(45) Date of Patent: Oct. 4, 2016

(54) INTERPOSER HAVING A DEFINED THROUGH VIA PATTERN

(71) Applicant: Taiwan Semiconductor Manufacturing Company, Ltd., Hsin-Chu (TW)

(72) Inventors: Shih-Wei Liang, Dajia Township (TW); Kai-Chiang Wu, Hsinchu (TW); Ming-Kai Liu, New Taipei (TW); Chia-Chun Miao, Taichung (TW); Chun-Lin Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/183,188

(22) Filed: Feb. 18, 2014

(65) Prior Publication Data

US 2014/0162405 A1   Jun. 12, 2014

Related U.S. Application Data

(62) Division of application No. 13/463,474, filed on May 3, 2012, now Pat. No. 8,664,768.

(51) Int. Cl.
*H01L 23/48*     (2006.01)
*H01L 23/498*    (2006.01)
*H01L 23/485*    (2006.01)
(Continued)

(52) U.S. Cl.
CPC ......... *H01L 23/485* (2013.01); *G06F 17/5068* (2013.01); *H01L 21/76898* (2013.01); *H01L 23/147* (2013.01); *H01L 23/481* (2013.01); *H01L 23/49827* (2013.01); *H05K 1/115* (2013.01); *H01L 23/49816* (2013.01); *H01L 23/49838* (2013.01); *H01L 2224/16225* (2013.01); *H01L 2924/15311* (2013.01); *H05K 1/0271* (2013.01); *H05K 2201/068* (2013.01); *H05K 2201/09781* (2013.01); *H05K 2201/10378* (2013.01)

(58) Field of Classification Search
CPC H01L 23/481; H01L 23/49827; H01L 24/16
See application file for complete search history.

(56) References Cited

U.S. PATENT DOCUMENTS 6,050,832 A    4/2000  Lee et al.
6,312,266 B1   11/2001 Fan et al.
(Continued)

FOREIGN PATENT DOCUMENTS

TW    201021173    6/2010
TW    I380415      12/2012

*Primary Examiner* — Pamela E Perkins
(74) *Attorney, Agent, or Firm* — Slater Matsil, LLP

(57) ABSTRACT

A structure includes a substrate having a plurality of balls, a semiconductor chip, and an interposer electrically connecting the substrate and the semiconductor chip. The interposer includes a first side, a second side opposite the first side, at least one first exclusion zone extending through the interposer above each ball of the plurality of balls, at least one active through via extending from the first side of the interposer to the second side of the interposer, wherein the at least one active through via is formed outside the at least one first exclusion zone and wherein no active through vias are formed within the at least one first exclusion zone, and at least one dummy through via extending from the first side of the interposer to the second side of the interposer, wherein the at least one dummy through via is formed within the at least one first exclusion zone.

20 Claims, 1 Drawing Sheet

(51) Int. Cl.
 *G06F 17/50* (2006.01)
 *H01L 21/768* (2006.01)
 *H01L 23/14* (2006.01)
 *H05K 1/11* (2006.01)
 *H05K 1/02* (2006.01)

(56) References Cited

U.S. PATENT DOCUMENTS

| | | | |
|---|---|---|---|
| 6,322,374 B1 | 11/2001 | Comtois et al. | |
| 6,392,296 B1 | 5/2002 | Ahn et al. | |
| 6,400,169 B1 | 6/2002 | Hembree | |
| 6,828,606 B2 | 12/2004 | Glebov | |
| 6,906,415 B2 | 6/2005 | Jiang et al. | |
| 7,397,129 B2 | 7/2008 | Lee | |
| 7,525,814 B2 | 4/2009 | Yuri et al. | |
| 7,902,638 B2 | 3/2011 | Do et al. | |
| 8,183,578 B2 | 5/2012 | Wang | |
| 8,183,579 B2 | 5/2012 | Wang | |
| 8,213,185 B2 | 7/2012 | Minegishi et al. | |
| 8,269,350 B1 | 9/2012 | Chen et al. | |
| 8,294,261 B2 | 10/2012 | Mawatari et al. | |
| 8,344,493 B2 | 1/2013 | West et al. | |
| 2009/0115050 A1* | 5/2009 | Kasuya | H01L 23/3677 257/701 |
| 2010/0078810 A1* | 4/2010 | Matsui et al. | 257/737 |
| 2011/0215360 A1* | 9/2011 | Wang | 257/99 |
| 2011/0278732 A1* | 11/2011 | Yu et al. | 257/774 |
| 2012/0043668 A1* | 2/2012 | Refai-Ahmed | H01L 23/04 257/777 |
| 2012/0142184 A1 | 6/2012 | Lin et al. | |
| 2012/0267751 A1 | 10/2012 | Haba et al. | |
| 2012/0298410 A1 | 11/2012 | Lu et al. | |
| 2012/0331435 A1* | 12/2012 | Rahman | 716/120 |
| 2013/0050972 A1 | 2/2013 | Mohammed et al. | |
| 2013/0063918 A1 | 3/2013 | Haba et al. | |
| 2013/0075922 A1* | 3/2013 | Huang et al. | 257/774 |
| 2013/0081866 A1 | 4/2013 | Furutani et al. | |
| 2013/0168855 A1* | 7/2013 | Chen et al. | 257/738 |

\* cited by examiner

INTERPOSER HAVING A DEFINED THROUGH VIA PATTERN

This application is a divisional of U.S. patent application Ser. No. 13/463,474, entitled "Interposer Having a Defined Through Via Pattern," filed on May 3, 2012, which application is incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Accordingly, interposers have been used to redistribute ball contact areas from that of the chip to a larger area of the interposer. Further, interposers have allowed for a three-dimensional (3D) package that includes multiple chips.

The redistribution of ball contact areas from that of the chip to a larger area of the interposer introduces high coefficient of thermal expansion (CTE) mismatch stress in the through vias of the interposer. This mismatch stress can cause defects in the interposer resulting in faulty interposers and ultimately unusable packages that include these faulty interposers. Accordingly, what is needed in the art is an improved packaging system.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a PoP structure including an interposer connecting a substrate having a ball grid array (BGA) to a chip with controlled collapse chip connection (C4) bumps. Other embodiments may also be applied, however, to other structures such as a through interposer stacking (TIS) structure including an interposer connecting a substrate having C4 bumps to a chip with µbumps.

Figure 1:
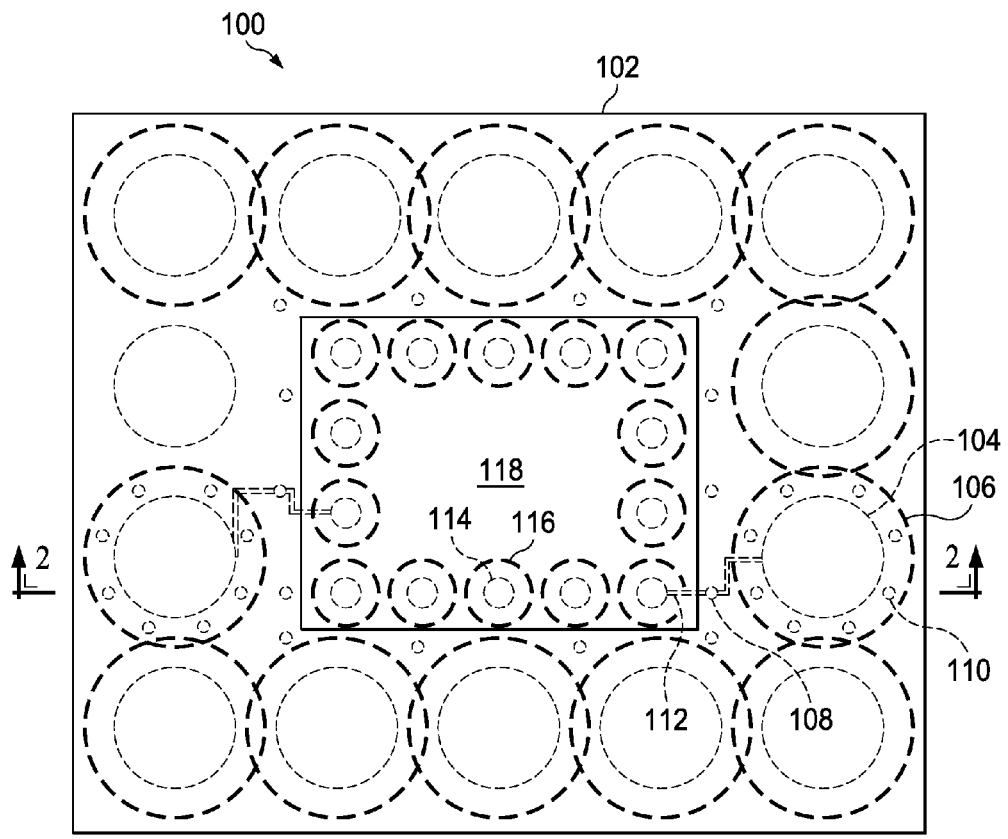
FIG. 1 is a top down view of a package-on-package (PoP) structure according to an embodiment.
Figure 2:
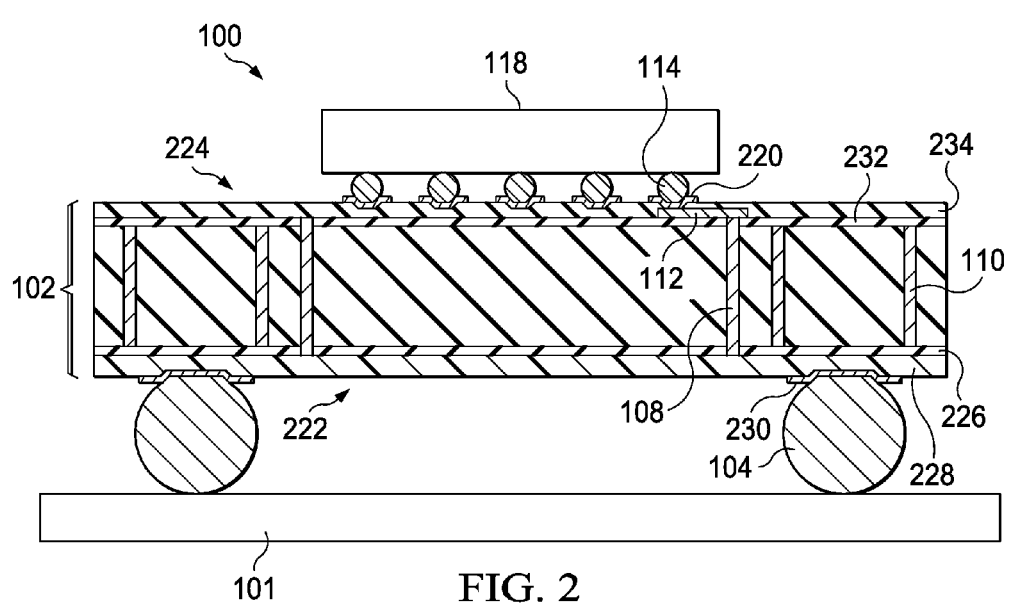
FIG. 2 is a cross section of the PoP structure of FIG. 1 taken along line 2-2 of FIG. 1.

With reference now to FIGS. 1 and 2, there is shown a top down view of package-on-package (PoP) structure 100 and a cross section of PoP structure 100 along line 2-2 of FIG. 1, respectively, according to an embodiment. PoP structure 100 includes interposer 102, which electrically connects an underlying substrate 101 to chip 118. Electrical connection is made through active through vias 108 formed in interposer 102. Dummy through vias 110 are also formed in interposer 102 to more uniformly distribute the stress in interposer 102.

In the illustrated embodiment, the underlying substrate is electrically connected to interposer 102 by balls 104 of a BGA in connection with under bump metallization (UBM) layer 230. The underlying substrate may also be connected to interposer 102 by, for example, a through substrate via (TSV) or other through via. In the embodiment, BGA balls 104 preferably have a diameter of about 200 µm to 500 µm. BGA balls 104 preferably have a pitch of about 300 µm to 500 µm.

In the illustrated embodiment, chip 118 is electrically connected to interposer 102 by C4 bumps 114 formed over under bump metallization layer 220. Chip 118 may also be electrically connected to interposer 102 by, for example, µbumps or copper pillars. In the embodiment, C4 bumps 114 preferably have a diameter of approximately 20 µm to 100 µm. C4 bumps 114 preferably have a pitch of less than approximately 200 µm, and more preferably have a pitch of about 100 µm.

The various materials in PoP structure 100 have different coefficients of thermal expansion (CTE). The different CTEs, e.g., the different CTEs of BGA balls 104 and interposer 102, and the different CTEs of C4 bumps 114 and interposer 102, cause CTE stress mismatch in interposer 102, particularly in stress concentration regions essentially centered over BGA balls 104 and essentially centered under C4 bumps 114. To reduce the effects of this high CTE mismatch stress on active through vias 108, active through vias 108 are formed outside the stress concentration regions. More specifically, active through vias 108 are formed outside of so-called exclusion zones 106 and 116 illustrated in FIG. 1. Exclusion zones 106 are approximately 20% to 30% larger than the diameter of BGA balls 104 and exclusion zones 116 are approximately 10% to 20% larger than the diameter of C4 bumps 114.

Dummy through vias 110 are preferably formed within exclusion zones 106, or exclusion zones 116 (not shown), or both (not shown). The formation of dummy through vias 110 in exclusion zones 106 and/or 116 results in a re-distribution of the localized stress caused by the different CTEs of the materials in PoP structure 100, e.g., the difference in the CTE of a silicon interposer and a copper through via. For example, an embodiment may include eight to twelve copper vias, wherein the copper material can carry, such as the copper can deform to release the stress. In the illustrated embodiment, there is one active through via 108 and eight dummy through vias for every BGA ball 104, with four of the dummy through vias being shared with neighboring BGA balls 104. In other embodiments, there is one active through via 108 and three to four dummy through vias 110 for every BGA ball 104. Similar via to connector ratios may be employed for embodiments including C4 bumps. Active through vias 108 and dummy through vias 110 preferably have a diameter of about 10 µm to 20 µm, and more preferably have a diameter of about 10 µm.

As illustrated in FIG. 2, interposer 102 may include multiple layers. The methods for forming interposers are well-known to persons having ordinary skill in the art and are not repeated herein. In the embodiment, interposer 102 is formed of silicon. In other embodiments, interposer 102 may be formed of other materials such as glass, an organic material, an insulator, or combinations thereof.

In the illustrated embodiment, first side 222 of interposer 102 includes first ILD layer 226, second ILD layer 228, and a metallization layer (not shown). As is known in the art, other numbers, types, and combinations of layers may be formed in addition to or in place of one or more of the layers illustrated in FIG. 2. In the illustrated embodiment, first ILD layer 226 is formed of nitride. In other embodiments, first ILD layer 226 may also be formed of any oxide, any nitride, any polymer, or combinations thereof. In the embodiment, second ILD layer 228 is a polymer layer. In other embodiments, second ILD layer 228 may be formed of low temperature polybenzoxazole (LTPBO), any oxide, any nitride, any polymer, or combinations thereof. In the embodiment, the metallization layer is a post passivation interconnect formed of copper. In other embodiments, the metallization layer may be formed of copper, aluminum, nickel, or combinations thereof. Other suitable materials for forming first ILD layer 226, second ILD layer 228, and the metallization layer known to persons of skill in the art may also be used.

In the illustrated embodiment, second side 224 of interposer 102 includes first ILD layer 232, second ILD layer 234, and metallization layer 112. As is known in the art, other numbers, types, and combinations of layers may be formed in addition to or in place of one or more of the layers illustrated in FIG. 2. In the embodiment, first ILD layer 232 is formed of oxide. In other embodiments, first ILD layer 232 may also be formed of any oxide, any nitride, any polymer, or combinations thereof. In the embodiment, second ILD layer 234 is a passivation layer. In other embodiments, second ILD layer 228 may be formed of LTPBO, any oxide, any nitride, any polymer, or combinations thereof. In the embodiment, metallization layer 112 is copper. In other embodiments, the metallization layer may be formed of copper, aluminum, gold, silver, nickel, or combinations thereof. Other suitable materials for forming first ILD layer 232, second ILD layer 234, and metallization layer 112 known to persons of skill in the art may also be used.

In the embodiment, BGA balls 104 connect the underlying substrate 101 to first side 222 of interposer 102. Under bump metallization (UBM) layer 230 overlies BGA balls 104 and electrically connects BGA balls 104 to the metallization layer formed in interposer 102 as described above. UBM layer 230 is preferably about 250 µm. In the illustrated embodiment, UBM layer 230 is formed of copper. In other embodiments, UBM layer 230 may be formed of copper, nickel, gold, silver, cobalt, or combinations thereof. Other suitable materials for forming UBM layer 230 known to persons of skill in the art may also be used.

Active through vias 108 and dummy through vias 110 are formed of copper in the illustrated embodiment. In other embodiments, active through vias 108 and dummy through vias 110 may be formed of copper, aluminum, gold, silver, nickel, or combinations thereof. Other suitable materials for forming active through vias 108 and dummy through vias 110 known to persons of skill in the art may also be used.

C4 bumps 114 electrically connect chip 118 to second side 224 of interposer 102 via UBM layer 220. UBM layer 220 may be formed of the same material as UBM layer 230 or may be formed of some other suitable material as discussed above with regard to UBM layer 230.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a package-on-package structure, the method comprising:
   providing a substrate having a plurality of balls, the plurality of balls including at least one ball electrically connected to the substrate;
   providing a semiconductor chip;
   forming an interposer having a first side and a second side opposite the first side, the interposer electrically connecting the substrate and the semiconductor chip;
   forming at least one active through via extending from the first side of the interposer to the second side of the interposer, wherein the at least one active through via is formed outside a plurality of exclusion zones, each of the plurality of exclusion zones extending through the interposer above a respective one of the plurality of balls, and wherein no active through vias are formed within the plurality of exclusion zones; and
   forming at least one dummy through via for each ball of the plurality of balls, the at least one dummy through via extending from the first side of the interposer to the second side of the interposer, wherein the at least one dummy through via is formed within at least one of the plurality of exclusion zones, and wherein, from a top down view, at least one exclusion zone, at least one active through via and at least one dummy through via are formed outside a projection of the semiconductor chip on the interposer.

2. The method of claim 1, wherein forming at least one active through via and forming at least one dummy through via further comprises forming the at least one active through via and the at least one dummy through via for at least one ball of the plurality of balls, wherein a ratio of active through vias and dummy through vias to the at least one ball of the plurality of balls redistributes localized stress in the package-on-package structure.

3. The method of claim 2, wherein the ratio comprises one active through via and eight dummy through vias for the at least one ball of the plurality of balls.

4. The method of claim 2, wherein the ratio comprises one active through via and four dummy through vias for the at least one ball of the plurality of balls.

5. The method of claim 1, wherein forming the interposer comprises forming a multi-layer interposer, wherein the first side of the interposer comprises a first ILD layer, a second ILD layer, and a metallization layer.

6. The method of claim 5, wherein the first ILD layer comprises an oxide, a nitride, a polymer, or a combination thereof, the second ILD layer comprises low temperature polybenzoxazole (LTPBO), an oxide, a nitride, a polymer, or a combination thereof, and the metallization layer comprises copper, aluminum, nickel, or combinations thereof, the method further comprising forming an under bump metallization (UBM) layer electrically connecting the metallization layer with at least one of the plurality of balls.

7. The method of claim 1, further comprising forming at least one second dummy through via within at least one second exclusion zone, the at least one second exclusion zone extending from the second side of the interposer to the first side of the interposer below at least one controlled collapse chip connection (C4) bump connected to the semiconductor chip, wherein the at least one active through via is formed outside the at least one second exclusion zone and wherein no active through vias are formed within the at least one second exclusion zone.

8. The method of claim 7, wherein forming the interposer comprises forming a multi-layer interposer, wherein the second side of the interposer comprises a first ILD layer, a second ILD layer, and a metallization layer.

9. The method of claim 8, wherein the first ILD layer comprises an oxide, a nitride, a polymer, or combinations thereof, the second ILD layer comprises a passivation layer, low temperature polybenzoxazole (LTPBO), an oxide, a nitride, a polymer, or combinations thereof, and the metallization layer comprises copper, aluminum, gold, silver, nickel, or combinations thereof, the method further comprising forming an under bump metallization (UBM) layer electrically connecting the metallization layer with the at least one C4 bump.

10. A method for forming a packaging structure, the packaging structure comprising a substrate, an interposer, and a semiconductor chip, the method comprising:
    electrically connecting the substrate and the interposer using a plurality of balls including at least one ball electrically connected to the substrate;
    electrically connecting the interposer and the semiconductor chip using a plurality of connectors, wherein the plurality of connectors comprises at least one of C4 bumps, μbumps, and copper pillars;
    forming active through vias extending from a first side of the interposer to a second side of the interposer opposite the first side, wherein the active through vias are formed outside first pre-determined stress concentration regions in the interposer, wherein the first pre-determined stress concentration regions are centered above each ball of the plurality of balls; and
    forming dummy through vias extending from the first side of the interposer to the second side of the interposer, wherein at least one dummy through via is formed within at least one of the first pre-determined stress concentration regions, and wherein, from a top down view, the at least one dummy through via is formed outside a projection of the semiconductor chip on the interposer.

11. The method of claim 10, wherein a diameter of the first pre-determined stress concentration regions is 20% to 30% larger than a diameter of at least one of the plurality of balls.

12. The method of claim 10, further comprising forming at least one second dummy through via within at least one second pre-determined stress concentration region in the interposer, wherein the second pre-determined stress concentration region is centered below a respective connector of the plurality of connectors.

13. The method of claim 12, wherein the active through vias are formed outside the at least one second pre-determined stress concentration region.

14. The method of claim 12, wherein a diameter of the at least one second pre-determined stress concentration region is 10% to 20% larger than a diameter of the respective connector of the plurality of connectors.

15. The method of claim 10, wherein forming the active through vias and forming the dummy through vias further comprises forming a pre-determined number of active through vias and a pre-determined number of dummy through vias for at least one ball of the plurality of balls.

16. The method of claim 10, wherein, from the top down view, at least one active through via is formed outside the projection of the semiconductor chip on the interposer.

17. The method of claim 10, further comprising forming at least one dummy through via for each of the plurality of balls.

18. A method for forming a packaging structure, the method comprising:
    electrically connecting a substrate and an interposer using a plurality of first connectors, at least one of the plurality of first connectors being electrically connected to the substrate;
    electrically connecting the interposer and a semiconductor chip using a plurality of second connectors, the plurality of second connectors comprising at least one of C4 bumps, μbumps, and copper pillars;
    forming at least one active through via extending from a first side of the interposer to a second side of the interposer opposite the first side, the active through via being formed outside first stress concentration regions in the interposer, the first stress concentration regions being centered above each connector of the first plurality of connectors; and
    forming at least one dummy through via extending from the first side of the interposer to the second side of the interposer, the at least one dummy through via being formed within at least one of the first stress concentration regions.

19. The method of claim 18, further comprising forming at least one second dummy through via within at least one second stress concentration region in the interposer, the second stress concentration region being centered below a respective connector of the second plurality of connectors.

20. The method of claim 19, wherein a diameter of the first stress concentration regions is 20% to 30% larger than a diameter of at least one of the first plurality of connectors, and wherein a diameter of the at least one second stress concentration region is 10% to 20% larger than a diameter of the respective connector of the second plurality of connectors.

* * * * *